United States Patent [19]

Hussey et al.

[11] 4,100,044

[45] Jul. 11, 1978

[54] PROCEDURE FOR REMOVING ALUMINUM FROM AN Al-Al$_3$Ni TWO-PHASE MATRIX

[75] Inventors: Charles L. Hussey, USAF Academy, Colo.; John C. Nardi, Brunswick, Ohio; Armand A. Fannin, Jr., USAF Academy, Colo.; Lowell A. King, Colorado Springs, Colo.; John K. Erbacher, USAF Academy, Colo.

[73] Assignee: The United States of America as represented by the Secretary of the Air Force, Washington, D.C.

[21] Appl. No.: 816,223

[22] Filed: Jul. 15, 1977

[51] Int. Cl.$^2$ .......................... C25F 3/00; C25F 3/04; C25F 5/00

[52] U.S. Cl. ................. 204/146; 204/129.8; 204/129.95

[58] Field of Search ............... 204/146, 129.8, 129.85, 204/129.95

[56] References Cited

U.S. PATENT DOCUMENTS

| | | | |
|---|---|---|---|
| 3,002,908 | 10/1961 | Hall | 204/146 |
| 3,257,299 | 6/1966 | Mekjean | 204/129.8 |
| 3,379,628 | 4/1968 | Burdick et al. | 204/129.85 |
| 3,615,900 | 10/1971 | Lee | 204/146 |
| 3,779,879 | 12/1973 | Scott | 204/146 |

*Primary Examiner*—T. M. Tufariello
*Attorney, Agent, or Firm*—Joseph E. Rusz; William J. O'Brien

[57] ABSTRACT

An electrolytic process for removing aluminum from a solid two-phase matrix of aluminum and trialuminum nickelide filaments by passing an electric current between an inert anode, a cathode composed of the matrix while both are immersed in an aluminum halide containing molten salt electrolyte.

4 Claims, 5 Drawing Figures

PROCEDURE FOR REMOVING ALUMINUM FROM AN Al-Al₃Ni TWO-PHASE MATRIX

STATEMENT OF GOVERNMENT INTEREST

The invention described herein may be manufactured and used by or for the Government for governmental purposes without the payment of any royalty thereon.

BACKGROUND OF THE INVENTION

This invention relates to a process for separating aluminum from an aluminum containing two-phase mixture. More particularly, this invention concerns itself with an electrolytic process for removing aluminum from a two-phase matrix consisting of aluminum and trialuminum nickelide.

The inclusion of a controlled eutectic alloy of trialuminum nitride within an aluminum body has been found to be an effective means of providing tensile strength enhancement for the aluminum. The alloy is grown within the aluminum body as an aligned microstructure in the form of whiskers. In addition to providing improved tensile strength, the whiskers of $Al_3Ni$ also find useful application in industrial and military microelectronics if they can be removed undamaged from the aluminum matrix in which they are embedded.

A number of methods are utilized for producing $Al_3N_i$ whiskers in an aluminum matrix. One utilizes a unidirectional solidification technique; whereas, another grows $Al_3Ni$ fiber bundles longitudinally in a rod-shaped aluminum matrix. Still other methods are contemplated and a considered research effort is being conducted in an attempt to develop even more efficient means of growing these useful fibers. A fundamental problem exists, however, in the removal and separation of the fibers from the Al-Al₃Ni two phase matrix within which they are formed. Therefore, a need exists for the development of an efficient and practical removal method in order to study the effectiveness of prior art procedures as well as those concerned in the future. Also, the usefullness of these fibers for microelectronic application is severely limited unless a means can be developed for their removal from the matrix without damage.

In previous methods, aqueous electrolyte or acid etches were utilized for removing or dissolving aluminum from an Al-Al₃Ni matrix. Unfortunately, these methods have always been accompanied by gas evolution resulting in "birdsnesting" of the fiber bundles as they are exposed. Still another problem encountered in using aqueous acid etches is their low selectivity of attack. For example, the Al₃Ni fibers are dissolved as well as the bulk aluminum. It becomes obvious, therefore, that an electrolyte that could sustain aluminum electrolysis without gas evolution while permitting selective attack on the bulk aluminum phase would circumvent the problems encountered in using prior art methods of separation.

After a considerable research effort, the problem of providing an efficient and effective means of separating aluminum from a two-phase matrix of aluminum and trialuminum nitride filaments has been solved by the electrolytic process of this invention. A molten salt electrolyte which contains an aluminum halide is used as the electrolyte and removal is effected by passing a current between an inert cathode and an anode composed of the two-phase Al-Al₃N matrix.

SUMMARY OF THE INVENTION

In accordance with this invention, an electrolytic separation procedure has been discovered for the selective separation of aluminum from a two-phase matrix containing aluminum and an aligned microstructure of a eutectic alloy, Al₃Ni. Separation is achieved by using aluminum halide containing molten salts as an electrolyte with the eutectic alloy forming the anodic element and an inert material forming the cathodic element of an electrochemical cell. Separation of the aluminum was achieved by passing a current between the cathode and anode while both are immersed in the molten electrolyte. The feasibility of the process was specifically pointed out by using as the electrolyte, either a 1:1 molar ratio of an aluminum chloride-sodium chloride melt at 175° C; or a 2:1 aluminum chloride -1-ethyl-pyridinium bromide melt at 23° C.

Accordingly, the primary object of this invention is to provide for an efficient means for effecting the removal of aluminum from a two-phase matrix consisting of aluminum and trialuminum nitride filaments.

Another object of this invention is to provide an electrolytic procedure that selectively removes unwanted aluminum from a Al-Al₃Ni two-phase matrix leaving the trialuminum nitride filaments unaffected.

Still another object of this invention is to provide an electrolytic process for removing aluminum from a two-phase Al-Al₃Ni matrix that does not produce unacceptable gaseous by-products.

A further object of this invention is to provide an electrolytic process for producing trialuminum nitride filaments that is simple, efficient, economical and utilizes conventional equipment and currently available materials that lend themselves mass production manufacturing techniques.

The above and still further objects and advantages of the present invention will become more readily apparent upon consideration of the following detailed description thereof when taken in conjunction with the accompanying drawings.

DESCRIPTION OF THE PREFERRED EMBODIMENT

With the above-mentioned and other objects in mind, the present invention contemplates a new and improved electrolytic process for removing aluminum from a two-phase matrix consisting of aluminum and trialuminum nickelide filaments. A molten salt mixture containing a anhydrous aluminum halide as a component is used as the electrolyte in the process. The process utilizes an inert material as the cathodic element and the aluminumtrialuminum nitride matrix as the anodic element. A current is passed between the cathode and the anode while both are immersed in the electrolyte to effect removal of the aluminum from the matrix containing anode.

Figure 3:
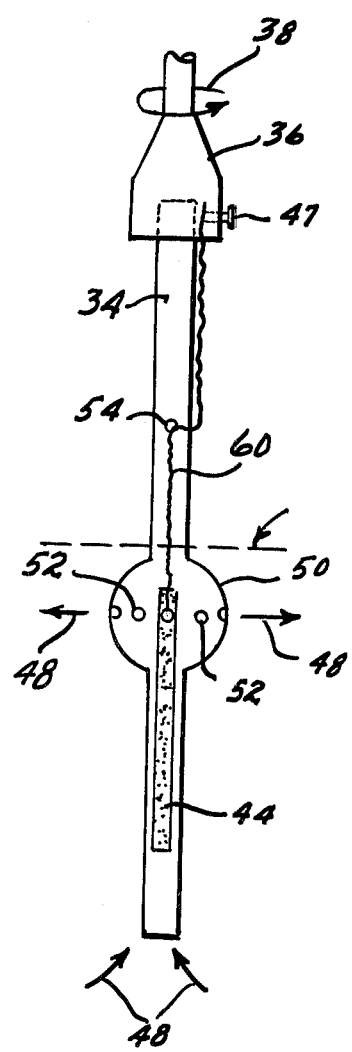
FIG. 3 represents a schematic illustration of a centrifugally induced stirring device for use in the cell of FIG. 4.

FIG. 3 discloses a three electrode cell useful for carrying out the process of this invention. It comprises an aluminum cap 10 with a teflon top 12 and a pyrex glass cell 14. The cell temperature for the process is maintained by a conventional platinum resistance controlled cartridge heater 16. A counter electrode 18 is constructed of a cup shaped piece of aluminum foil 22 while a reference electrode 20 is constructed of a spiral aluminum wire 24. The wire 24 is isolated from the electrolyte melt 26 by a 10 mm fine porosity pyrex frit 28. All potentials determined during the development of the process of this invention were measured against this electrode. A working electrode 30 is composed of an aluminum-trialuminum nicolide matrix rod 32.

FIG. 3 depicts an alternative working electrode that can be employed in place of electrode 30. It is a centrifugally induced stirring device composed of a glass tube 34, an aluminum chuck 36 which rotates in the direction of the arrow 38. An aluminum electrode 40 is attached to the chuck by a set screw 42 and in turn is attached to an Al-Al$_3$Ni specimen 44. Numeral 46 indicates the level of immersion for this electrode in the electrolyte 26 while arrows indicate the electrolyte flow when the device is rotated. A glass bulb 50 is positioned in the tube 34 and is perforated with holes 52 to facilitate the flow of the electrolyte. A hole 54 is also positioned in tube 34 for the aluminum lead 40.

The counter electrode 18 may be any suitable inert metal or electrically conducting carbon material such as aluminum, tungsten, nickel, vitreous carbon or pyrolytic graphite. The passing of a current through the electrochemical cell effected removal of aluminum from the aluminum-trialuminum matrix rod 32 and was supplied by a conventional potentiostat-galvanostat not shown. The apparatus shown in FIGS. 2 and 3 was utilized for convenience and a considerable latitude in the apparatus set up may be resorted to in carrying out the process of the invention.

The electrolytic process of the invention employs an anhydrous aluminum halide containing molten salt electrolyte. Two specific electrolytes found to be especially suitable were an equimolar mixture of aluminum chloride and sodium chloride which operated at a temperature of 175° C; and a 2:1 mole ratio of aluminum chloride and ethylpyridinium bromide which operated at a temperature of 25° C.

The aluminum chloride-sodium chloride electrolyte was prepared in a conventional manner as follows:

Anhydrous iron free aluminum chloride (Fluka, A. G., Tridom Chemical Inc., 255 Oser Avenue, Hauppange, NY 11787) was fused with excess sodium chloride (Baker, A. R. grade, J. T. Baker Chemical Co., 22 Red School Lane, Phillipsburg, NY 08865) at 175° C and then electrolytically purified ethylpyridinium bromide was prepared by refluxing ethyl bromide in an excess of pyridine and acetone, filtering and resultant precipitate, washing with anhydrous ether, and vacuum drying at 34° C. The ethylpyridinium bromide was then combined with aluminum chloride in a 1:2 molar ratio resulting in a molten salt which is liquid at room temperature. The aluminum chloride-ethylpyridinium bromide mixture was electrolytically purified in the same manner as the aluminum chloride-sodium chloride, giving a melt which was water-like in appearance.

The aluminum chloride-sodium chloride and aluminum chloride-ethylpyridinium bromide electrolytes described above were selected because of convenience. The former electrolyte is one member of a whole class of electrolytes having the formula AlX$_3$.MY where X and Y may be similar or dissimilar and represent halogen radicals selected from the group consisting of chlorine, bromine and iodine. The metal M may be any one of or a mixture of the alkali metals. The second electrolyte mixture; namely, the aluminum chloride-ethylpyridinium bromide mixture is a member of the same class, where M now is one of a large number of tetrasubstituted ammonium compounds. One can "build in" to the electrolyte nearly any desired liquid range and electric conductivity by making M a mixture of alkali metal and ammonium species.

Figure 2:
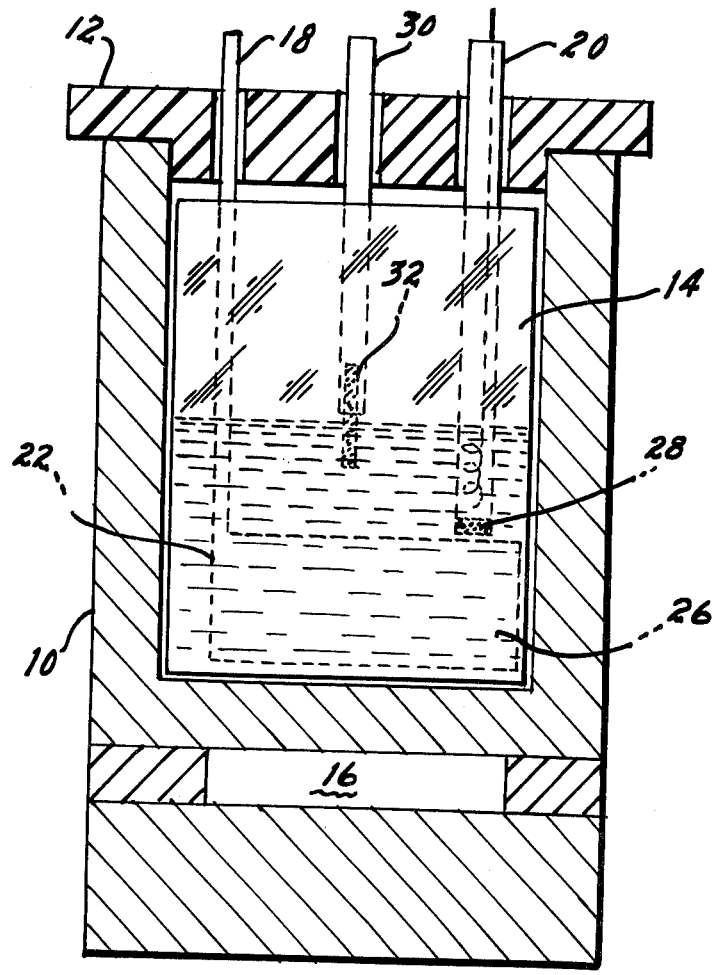
FIG. 2 represents a schematic illustration of a three electrode cell suitable for use in the process of this invention.

In the operation of the process of this invention, the Al-Al$_3$Ni matrix specimen is placed in the desired holder 30 in the cell shown in FIG. 2 and made anodic, that is, an oxidative electrode reaction is caused at the specimen:

(1) 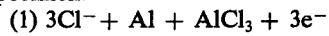

At the counter electrode a reductive (cathodic) electrode reaction is caused:

(2) 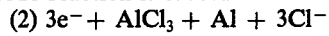

The net effect is the removal of aluminum from the matrix specimen and deposition of aluminum at the counter electrode. Any current density may be used providing that the potential applied between the electrodes does not exceed the decomposition potential of the electrolyte.

Constant current and controlled potential electrolysis were accomplished with a potentiostat/galvanostat (Princeton Applied Research Corp. Model 173). A voltage programmer (Princeton Applied Research Corp. Model 175) was coupled to the potentiostat/galvanostat for the linear sweep voltammetry data shown in FIGS. 1, 4 and 5.

Samples of the Al-Al$_3$Ni matrix were obtained as 1.25 inch by 0.125 inch diameter rods. In addition, a pure sample of Al$_3$Ni alloy was furnished which had been produced by fusing stoichiometric quantities of aluminum and nickel. Electrodes were fashioned from the samples by wrapping aluminum wire around the ends of the specimens that were not immersed in the melt to provide electrical contact. The immersed area of the particular Al-Al$_3$Ni specimen under consideration was measured geometrically. The Al$_3$Ni electrode, however, was quite porous, and only an appropriate geometrical area, 1 cm$^2$, could be measured.

In a typical electrolysis experiment the Al-Al$_3$Ni matrix rod or a piece of Al$_3$Ni was used as a working electrode in a three electrode cell of the type shown in FIG. 2. Cell temperature for experiments with the 1:1 AlCl$_3$NaCl melt was maintained to ±0.5° C by means of the platinum resistance controlled furnace 16. The counter electrode 18 was a cup shaped piece of aluminum foil (Research Organic/Inorganic Co., m5n purity), while the reference electrode 20 was a spiral aluminum wire (Alfa-Ventron, m5n purity) isolated from the melt by a 10 mm fine porosity Pyrex frit 28. All potentials described during testing were measured against this electrode, i.e., the Al(III) Al couple.

For experiments requiring a flowing electrolyte stream, the centrifugally induced stirrer of FIG. 3 was employed in place of electrode 30. When this device was turned with an electrode rotator (Pine Instrument Co., ASR-2) at speeds above 50 RPM, a flowing electrolyte stream was present at the electrode 44 suspended in the center of the stirrer 34.

Figure 1:
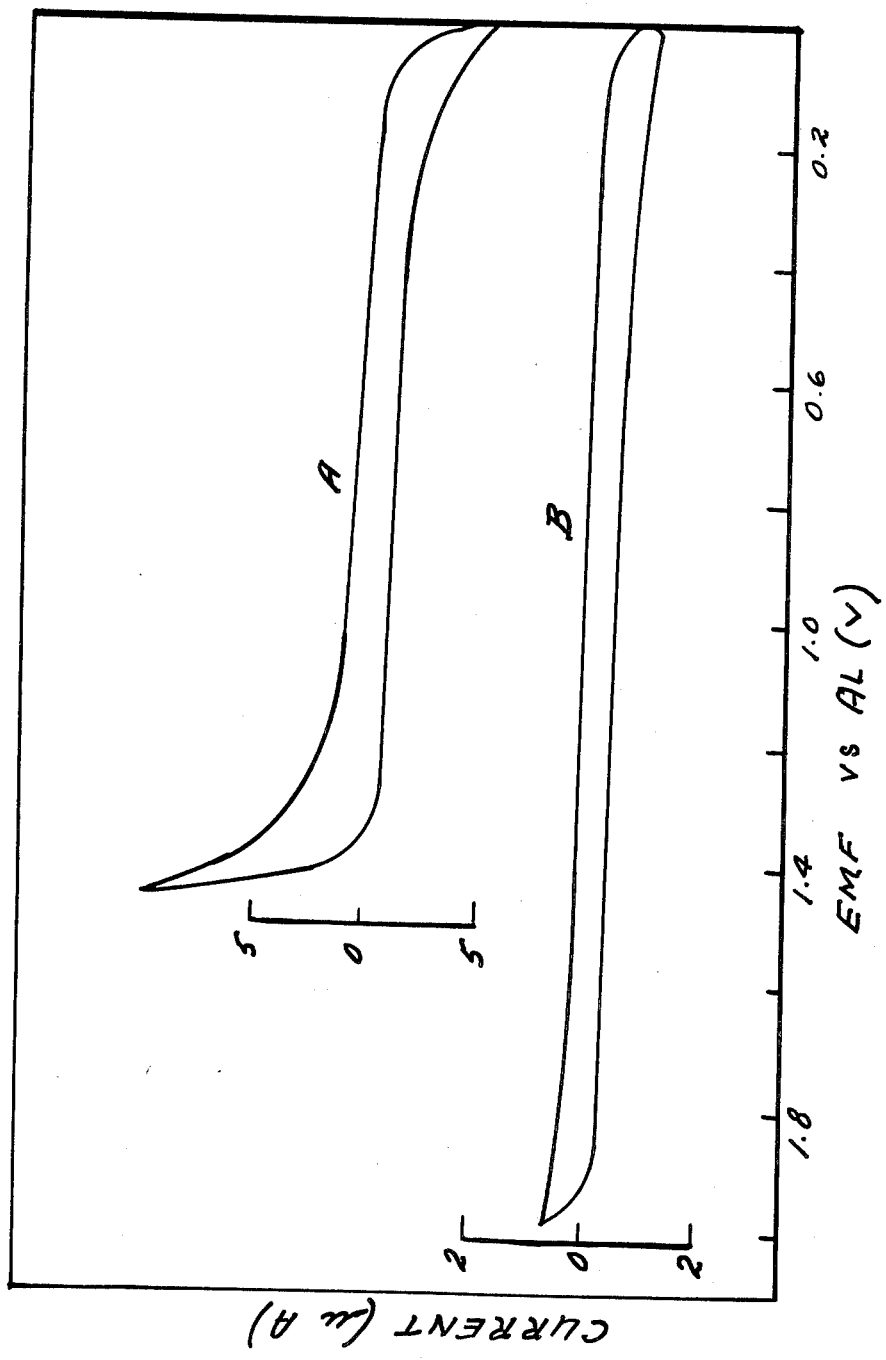
FIGS. 1, 4 and 5 are graphical illustrations showing current-potential curves for the anodization of aluminum and tri-aluminum nickelide.

In order to determine the approximate potential range in which aluminum could be removed by electrolysis without appreciable damage to the trialuminum nickelide filaments, current-potential curves for the anodization of aluminum and trialaluminum nickelide were constructed using linear sweep voltametry. The working electrode 30 was either pure aluminum wire or Al$_3$Ni, respectively. The potential of the working electrode 30 was varied linearly from a potential of 0.0V vs. Al(III)/Al to the anodic limit of the melt under consideration. In the 1:1 AlCl$_3$-NaCl melt at 175° the practical limit is about 2.2V anodic of the aluminum reference electrode 20 and represents the oxidation of chloride to chlorine. The useful limit of the 2:1 AlCl$_3$-EPB melt is about 1.75V as shown in FIG. 1 and represents the oxidation of bromide to bromine. The potential at which attack on the Al$_3$Ni occurs in 2:1 AlCl$_3$-EPB is about 1.0V, as shown in FIG. 4 at the 20 mV/sec sweep rate used for these studies.

Figure 4:
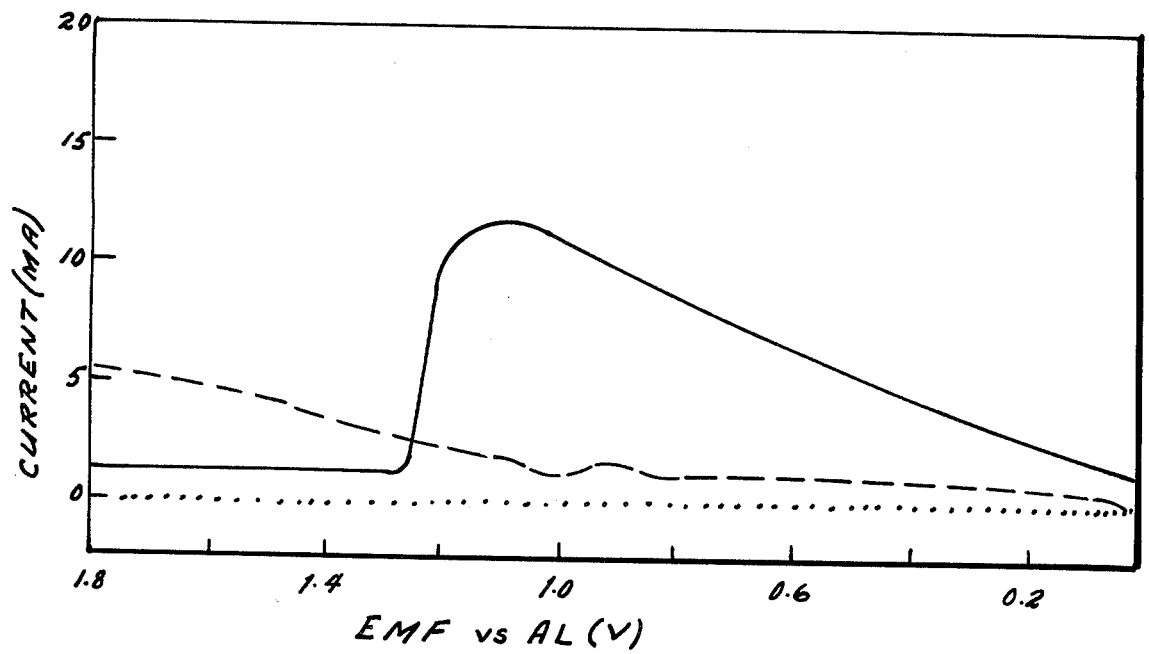

The voltammogram for aluminum anodization in the 2:1 AlCl$_3$-EPB melt in FIG. 4 exhibits an interesting feature. The shape of the current-voltage curve suggests formation of a passivating layer of aluminum chloride. This feature was not observed for the 1:1 AlCl$_3$-NaCl melt of FIG. 5 during the time span of the voltammogram. Two factors may have contributed to the absence of passivation in the latter case. First, the melt is able to solvate approximately an additional mole of aluminum chloride per mole of electrolyte before forming a solid aluminum chloride layer. Second, thermal convection currents in the heated melt prevented formation of a sodium ion depleted diffusion layer. Therefore, passivation behavior can be alleviated somewhat by using some type of forced convection. A special stirrer as shown in FIG. 3, was constructed in order to provide uniform forced convection. An experiment with this device is described below. Such a stirrer should provide other advantages as well; for example, a more complete stripping of aluminum from the interior of the exposed filament bundle as a result of the flowing electrolyte stream.

Figure 5:
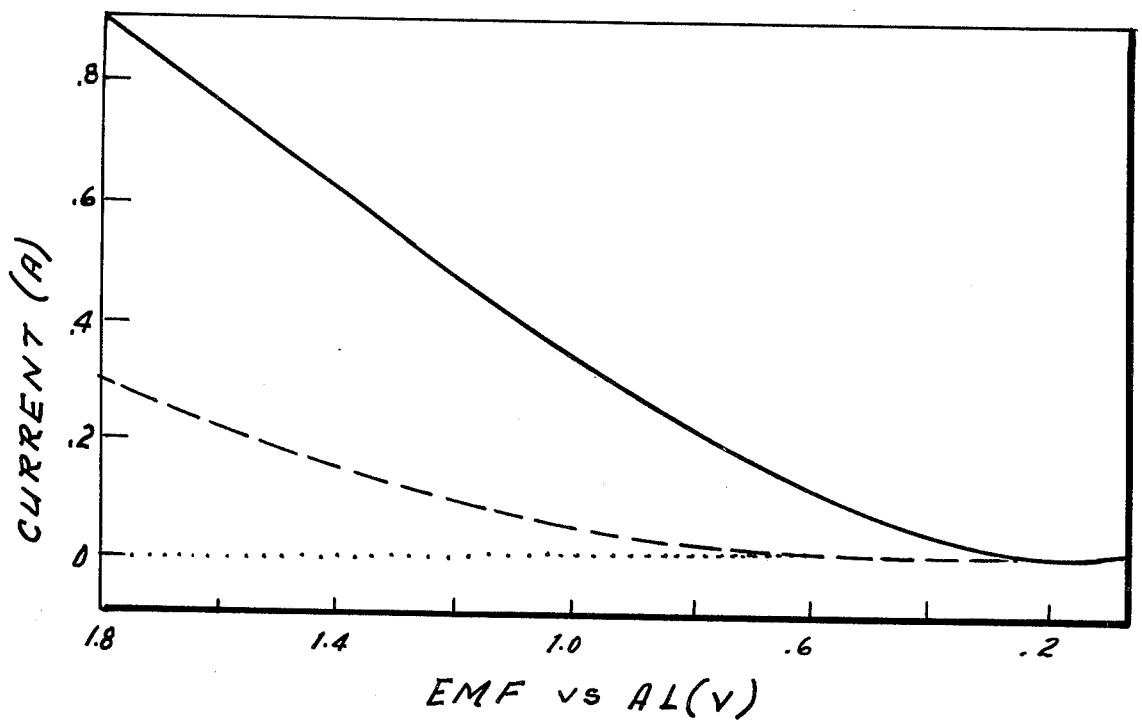

The relative amounts of material that can be removed anodically from an aluminum specimen in the two melts examined in this study can be judged by comparison of the linear sweep voltammograms at a given potential as shown in FIGS. 5 and 5. At 0 OV vs. Al(III)/Al, the current at an aluminum wire electrode in the 1:1 AlCl$_3$-NaCl melt was about 20 times that of a similar electrode in the 2:1 AlCl$_3$-EPB melt. Since the quantity of material that can be removed anodically is governed by Faraday's law, the weight in grams of aluminum, W, that can be removed by electrolysis in t seconds at a current of $i$ amperes is:

(3) $W = 9.33 \times 10^{-5} it$

For a typical specimen of 1.28 g containing 20 wt-% Al$_3$Ni as the rod phase, an electrolysis time of 15 hours in the 1:1 AlCl$_3$-NaCl melt and 336 hours in the 2:1 AlCl$_3$-EPB melt would be required to remove all bulk aluminum. These times were calculated for an unstirred solution assuming that the limiting current at the electrode is that reflected at 0.8V vs. Al(III)/Al from the linear sweep voltammograms. The values calculated represent an upper bound in time since stirring increases the current density.

Test data for the process of this invention as shown in FIGS. 1, 4 and 5. FIG. 1 shows cyclic voltammograms of the 2:1 AlCl$_3$-EPB melt A, and the 1:1 NaCl - AlCl$_3$ melt B, at a glassy carbon electrode ($A = 0.215$ cm$^2$), sweep rate = 100 mV/sec. FIG. 4 shows anodic linear sweep voltammograms for Al and Al$_3$Ni electrolysis in the 2:1 AlCl, -EPB melt at 23° C with the solid line representing pure aluminum wire ($A = \sim 1$ cm$^2$); the dash line representing a trialuminum nickelide ingot ($A = \sim$/cm$^2$); and the dotted line representing a glassy carbon electrode ($A = 0.215$ cm$^2$). FIG. 5 shows anodic linear sweep voltammograms for Al and Al$_3$Ni electrolysis in the 1:1 AlCl$_3$; NaCl melt at 175° C with the solid dash and dotted lines representing the same elements as in FIG. 4.

Preliminary electrolysis experiments were accomplished in the 2:1 AlCl$_3$-EPB melt by anodizing the Al-Al$_3$Ni matrix working electrode while stirring with a propeller. Portions of the rod which were not desired to be anodized were coated with heat shrinkable Teflon tubing. A microphograph of an unpolished Al-Al$_3$Ni matrix specimen prior to electrolysis showed no evidence of exposed Al$_3$Ni whiskers. The same specimen was subjected to anodization by constant current at 0.16A/cm$^2$ in a stirred solution of 2:1 AlCl$_3$-EPB, removed and washed succesively with dimethylsulfoxide, distilled water, and acetone. Microphotographs revealed that bulk aluminum had been removed from the surface of the specimen and exposed Al$_3$Ni whiskers were present. Visual inspection revealed no discernible damage to the fibers. During electrolysis the potential of the Al-Al$_3$Ni electrode rose to 0.1V vs. Al(III)/Al. An experiment at 0.54 A/cm$^2$ with 0.22V polarization produced the same result. At this current density the cell potential exceeded 3V vs. A(III)/Al when stirring had been discontinued.

Al-Al$_3$Ni electrolysis was accomplished in the 1:1 AlCl$_3$-NaCl melt in a manner similar to the procedure used for the 2:1 AlCl$_3$-EPB melt. Electrolysis at a current density of 0.180 A/cm$^2$ in an unstirred solution resulted in a polarization of 0.3V vs. the Al(III)/Al couple. Microphotographs revealed essentially the same result as that obtained previously, except that electrolysis was much faster and no stirring was required to offset passivation.

The centrifugally induced stirrer, FIG. 3, containing an Al-Al$_3$Ni rod was rotated at about 160 RPM during passage of a 0.10 A/cm$^2$ current. An apparent resistance polarization of 0.5V was noted indicating that the device had caused moderate shielding of the Al-Al$_3$Ni electrode within. Microphotographs of a portion of the matrix sample after electrolysis showed that even removal of bulk aluminum from the specimen had taken place.

The successful electrolytic removal of aluminum from a two phase matrix of aluminum containing trialuminum nickelide whiskers in accordance with the process of this invention has been demonstrated in two different molten salt electrolytes. However, it should be understood that these specific embodiments are illustrative only and should not be construed as limiting the invention in any way. Various alterations and modifications may be made without departing from the spirit of the invention, the scope of which is defined by the appended claims.

What is claimed is:

1. An electrolytic process for separating aluminum from a solid, two-phase matrix of aluminum and trialuminum nickelide filaments which comprises the steps of passing an electric current between (1) a cathode composed of an inert material and (2) an anode composed of a two phase matrix of aluminum and trialuminum nickelide filaments while (3) both anode and cathode are immersed in an anhydrous aluminum halide containing molten salt electrolyte to effectively remove said aluminum from said matrix without adversely affecting said trialuminum nickelide filaments.

2. A process in accordance with claim 1 wherein said electrolyte is composed of a material having the formula $AlX_3 \cdot MY$ wherein X and Y are similar or dissimilar and selected from the group consisting of chlorine bromine and iodine; M is a material selected from the group consisting of alkali metal and tetrasubstituted ammonium compounds.

3. A process in accordance with claim 2 wherein said electrolyte is an equimolar mixture of aluminum chloride and sodium chloride.

4. A process in accordance with claim 2 wherein said electrolyte is a 2:1 molar ratio of aluminum chloride and ethylpyridinium.

* * * * *

UNITED STATES PATENT OFFICE
CERTIFICATE OF CORRECTION

Patent No. 4,100,044            Dated July 11, 1978

Inventor(s) Charles L. Hussey et al

It is certified that error appears in the above-identified patent and that said Letters Patent are hereby corrected as shown below:

Column 1, line 10, "nitride" should read --nickelide--.
Column 1, line 29, "$Al_2N_i$" to --$Al_3Ni$--.

Column 1, line 29, "One" should read --One method--.
Column 1, lines 30 and 31, "; Whereas, another" should read --, whereby one--.
Column 1, line 33, "considered" should read --considerable--.
Column 2, line 17 "chloride-1-ethyl" should read --chloride and ethyl--.
Column 2, line 25, "nitride" should read --nickelide--.
Column 2, line 32, "nitride" should read --nickelide--.
Column 3, line 2, "FIG. 3" should read --FIG. 2--.
Column 3, line 16, "nicolide" should rread --nickelide--.
Column 3, line 25, "arrows" should read --arrows 48--.
Column 3, line 35, "matrix" should read --nickelide matrix--.
Column 3, line 55, "purified" should read --purified. The--.
Column 4, line 3, "$AlX_3.MY$" should read --$AlX_3MY$--.

Column 4, line 20, "$3Cl^- + Al+AlCl_3 + 3e^-$" should read

--$3Cl^- + Al \rightarrow AlCl_3 + 3e^-$--.

UNITED STATES PATENT OFFICE
CERTIFICATE OF CORRECTION

Patent No. 4,100,044          Dated July 11, 1978

Inventor(s) Charles L. Hussey et al

It is certified that error appears in the above-identified patent and that said Letters Patent are hereby corrected as shown below:

Column 4, line 23, "$3e^- + AlCl_3 + Al + 3Cl^-$" should read
--$3e^- + AlCl_3 \rightarrow Al + 3Cl^-$--.

Column 5, line 46, "FIGS. 5" should read -- FIGS. 4--.
Column 5, line 46, "At 0.0V" should read --At 0.0V--.

Signed and Sealed this

*Fifteenth* Day of *May 1979*

[SEAL]

Attest:

RUTH C. MASON          DONALD W. BANNER
*Attesting Officer*          *Commissioner of Patents and Trademarks*